United States Patent
Balakrishnan et al.

(10) Patent No.: US 10,396,829 B2
(45) Date of Patent: *Aug. 27, 2019

(54) TRANSFORMATION BASED FILTER FOR INTERPOLATION OR DECIMATION

(71) Applicant: Texas Instruments Incorporated, Dallas, TX (US)

(72) Inventors: Jaiganesh Balakrishnan, Bangalore (IN); Suvam Nandi, Bangalore (IN); Sundarrajan Rangachari, Bangalore (IN)

(73) Assignee: TEXAS INTSTUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,478

(22) Filed: Aug. 23, 2018

(65) Prior Publication Data

US 2018/0367169 A1 Dec. 20, 2018

Related U.S. Application Data

(63) Continuation of application No. 15/395,135, filed on Dec. 30, 2016, now Pat. No. 10,090,866.

(51) Int. Cl.
| | |
|---|---|
| *G06F 17/17* | (2006.01) |
| *H04B 1/00* | (2006.01) |
| *H04B 1/04* | (2006.01) |
| *H04B 1/10* | (2006.01) |
| *G06F 5/01* | (2006.01) |
| *H03H 17/02* | (2006.01) |
| *H03H 17/06* | (2006.01) |

(52) U.S. Cl.
CPC .............. *H04B 1/0042* (2013.01); *G06F 5/01* (2013.01); *H03H 17/0211* (2013.01); *H03H 17/0273* (2013.01); *H03H 17/0275* (2013.01); *H03H 17/0657* (2013.01); *H03H 17/0664* (2013.01); *H04B 1/0046* (2013.01); *H04B 1/0475* (2013.01); *H04B 1/1027* (2013.01)

(58) Field of Classification Search
None
See application file for complete search history.

(56) References Cited

U.S. PATENT DOCUMENTS

| | | | |
|---|---|---|---|
| 6,317,765 B1 | 11/2001 | Page et al. | |
| 6,870,492 B1 | 3/2005 | Jensen | |

(Continued)

*Primary Examiner* — David H Malzahn
(74) *Attorney, Agent, or Firm* — John R. Pessetto; Charles A. Brill; Frank D. Cimino (57) ABSTRACT

A digital filter for interpolation or decimation and a device incorporating the digital filter is disclosed. The digital filter includes a filter block, a first transformation circuit coupled to the filter block and an input stream coupled to provide input values to a component selected from the filter block and the first transformation circuit. The filter block includes a pair of sub-filters having respective transformed coefficients, the respective transformed coefficients of a first sub-filter of the pair of sub-filters being symmetric and the respective transformed coefficients of a second sub-filter of the pair of sub-filters being anti-symmetric. The first transformation circuit is coupled to perform a first transformation; the filter block and the first transformation circuit together provide suppression of undesired spectral images in final outputs of the digital filter.

12 Claims, 6 Drawing Sheets

(56) References Cited

U.S. PATENT DOCUMENTS

| | | |
|---|---|---|
| 7,102,547 B2 | 9/2006 | Jensen |
| 7,620,673 B2 | 11/2009 | Noga |
| 10,090,866 B2* | 10/2018 | Balakrishnan ....... H04B 1/0042 |
| 2002/0038324 A1 | 3/2002 | Page et al. |
| 2008/0071846 A1 | 3/2008 | Sadafale et al. |
| 2017/0371840 A1 | 12/2017 | Lubberhuizen |
| 2018/0191383 A1* | 7/2018 | Balakrishnan ....... H04B 1/0042 |
| 2018/0367169 A1* | 12/2018 | Balakrishnan ..... H03H 17/0657 |

* cited by examiner

TRANSFORMATION BASED FILTER FOR INTERPOLATION OR DECIMATION

CROSS REFERENCE TO RELATED APPLICATION(S)

This continuation application claims priority to U.S. patent application Ser. No. 15/395,135, filed Dec. 30, 2016, now U.S. patent application Ser. No. 10,090,866, issued Oct. 2, 2018, which is incorporated herein by reference in its entirety.

FIELD OF THE DISCLOSURE

Disclosed embodiments relate generally to the field of filters for interpolation or decimation. More particularly, and not by way of any limitation, the present disclosure is directed to a transformation based filter for interpolation or decimation.

BACKGROUND

Radio frequency (RF) sampling transceivers are an emerging trend targeting the next generation of wireless base stations. In an RF sampling transceiver, the conversion between analog and digital signals is performed directly using either a high speed, high performance digital-to-analog converter (DAC) at, e.g., 14 bits, 9 GSPS or an analog-to-digital converter (ADC) at, e.g., 3 GSPS. The high-speed conversion avoids the need for mixers in the RF/analog domain. This architecture can enable simultaneous multi-band transmission, by employing digital up-converters (DUC) for each of the bands, using a single RF/analog transmitter chain. Similarly, the architecture can enable simultaneous multi-band reception, by employing digital down-converters (DDC) for each of the bands, using a single RF/analog receiver chain.

In one example, a complex baseband transmission signal that consists of I (in-phase) and Q (quadrature) signals, at a sampling rate of 500 MHz, is interpolated (e.g., by 18) and up-converted to obtain an RF signal at 9 giga-samples per second (GSPS). However, digital complexity and power consumption of the DUC could be significant, as it needs to interpolate the complex baseband samples to generate the RF DAC samples at GSPS rates, with suppression of the out-of-band images. Cost, which is dependent on the area occupied by the device, and power consumption are key parameters for these applications.

SUMMARY

Disclosed embodiments provide a low power digital filter for interpolation or decimation that also reduces digital area. The digital filter accomplishes the reduced area by performing a transformation that reduces the number of components necessary to perform filtering in the digital domain. Using a set of desired filter coefficients, a transformation is performed on the filter coefficients to introduce structure into the sub-filters, e.g., either symmetry or anti-symmetry. For an interpolation filter, a second transformation is performed on the output of the sub-filters to reverse the first transformation and recover a desired output. For a decimation filter, the second transformation is performed on the inputs to the transformed sub-filters. The techniques presented are generic and may be applied to any signal chain transceiver that employs an interpolation or decimation filter.

In one aspect, an embodiment of a digital filter is disclosed. The digital filter includes a filter block comprising a pair of sub-filters having respective transformed coefficients, the respective transformed coefficients of a first sub-filter of the pair of sub-filters being symmetric and the respective transformed coefficients of a second sub-filter of the pair of sub-filters being anti-symmetric; a first transformation circuit coupled to the filter block to perform a first transformation, the filter block and the first transformation circuit together providing suppression of undesired spectral images in final outputs of the digital filter; and an input stream coupled to provide input values to a component selected from the filter block and the first transformation circuit.

In another aspect, an embodiment of an electronic device is disclosed. The electronic device includes a digital interpolation filter for interpolating by M, where M is an integer, the digital interpolation filter comprising: a filter block comprising a pair of sub-filters having respective transformed coefficients, the respective transformed coefficients of a first sub-filter of the pair of sub-filters being symmetric and the respective transformed coefficients of a second sub-filter of the pair of sub-filters being anti-symmetric, delay elements coupled to provide input values to the filter block, and a first transformation circuit coupled to receive intermediate outputs from the filter block and to perform a first transformation on the intermediate outputs to form final outputs of the pair of sub-filters, the filter block and the first transformation circuit together providing suppression of undesired spectral images in final outputs of the digital interpolation filter; and a digital-to-analog converter coupled to receive the final outputs of the digital interpolation filter and to provide an analog output signal.

In yet another aspect, an embodiment of an electronic device is disclosed. The electronic device includes an analog-to-digital converter coupled to receive an analog input signal and to provide a digital signal; and a digital decimation filter for decimating by M, the digital decimation filter comprising: a first transformation circuit coupled to perform a first transformation on input values of the digital signal and to provide transformed input values, and a filter block comprising a pair of sub-filters having respective transformed coefficients, the respective transformed coefficients of a first sub-filter of the pair of sub-filters being symmetric and the respective transformed coefficients of a second sub-filter of the pair of sub-filters being anti-symmetric, the filter block being coupled to receive the transformed input values and to provide final outputs of the digital decimation filter.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 6A:
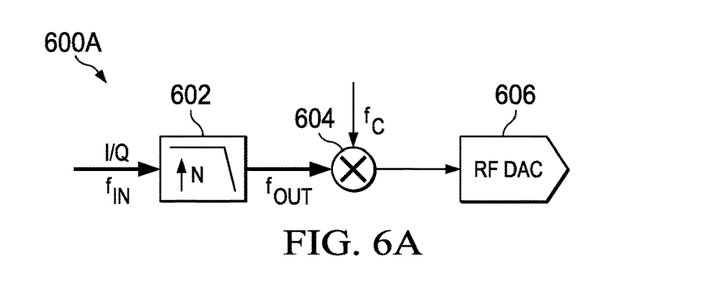
FIG. 6A depicts a block diagram of a digital up-converter in which a disclosed interpolation filter can be utilized according to an embodiment of the disclosure.

Turning first to FIG. 6A, a block diagram is shown of a digital-up-converter 600A in which an interpolation filter 602 according to the disclosed embodiments can be utilized. The complex baseband I/Q samples have a sampling rate of $f_{IN}$. The interpolation filter 602 up-samples this signal by a factor of N, inserting (N−1) zeroes between incoming samples, then filters out the images created by the up-sampling process. An example embodiment uses a finite impulse response (FIR) filter for interpolating the up-sampled input signal. The relationship between the sampling rates of the output and input signals of interpolation filter 602 is $f_{OUT}=N*f_{IN}$. After interpolation, the signal $f_{OUT}$ is up-converted to a center frequency $f_C$, using a digital mixer 604, and passed on to an RF sampling DAC 606 that is operating at a sampling rate of $f_S$ (which is the same as $f_{OUT}$ in this case).

Figure 6B:
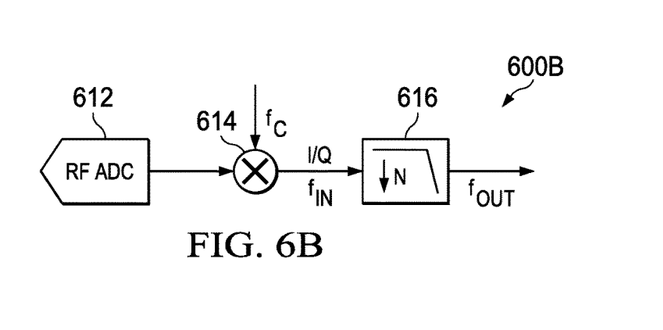
FIG. 6B depicts a block diagram of a digital down-converter in which a disclosed decimation filter can be utilized according to an embodiment of the disclosure.
Figure 7:
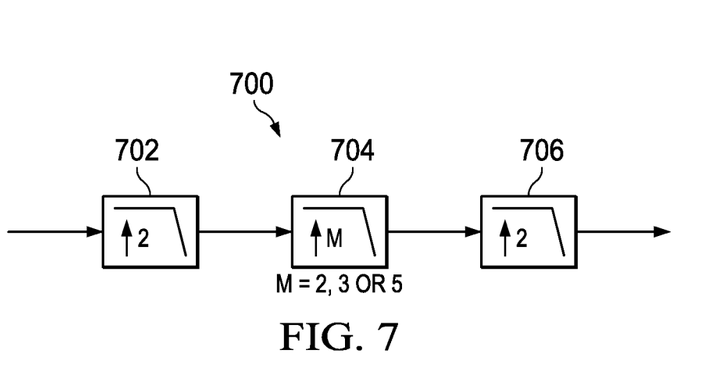
FIG. 7 depicts a block diagram that depicts the use of multiple interpolation stages.

In DUC 600A, the use of interpolation filter 602 provides flexibility in the choice of baseband sampling rate $f_{IN}$ for a given RF DAC sampling rate $f_S$. In one example embodiment, at a fixed RF DAC sampling rate of 6 GSPS, multiple baseband sampling rates of $f_{IN}$ can be supported, e.g., sampling rates of 300 MSPS, 500 MSPS and 750 MSPS can be utilized by selecting values of 20, 12 and 8 respectively for the interpolation factor N. FIG. 7 depicts an architecture 700 that incorporates multiple interpolation stages to provide support for different interpolation factors (e.g., 8, 12 and 20). The multi-stage architecture 700 includes an interpolate-by-2 stage 702 cascaded with an interpolate-by-M stage 704 and an interpolate-by-2 stage 706, where M can take on a value of 2, 3 or 5. Similar flexibility can be provided to decimation filter 616 in DDC 600B by using a cascade of decimation filters.

The calculations performed by an interpolation filter are explained below, followed by an example implementation. The sequence x(n) is used herein to represent the input signal to the interpolation filter, which can be an interpolate-by-M filter. For the sake of simplicity in this discussion, the interpolation filter is assumed to have P taps, where P=M*L and L is an integer. Coefficients for the interpolation filter are represented by the sequence $\{h_0, h_1, \ldots, h_{ML-1}\}$. The interpolation filter computes the up-sampled and interpolated signal as shown below:

$$u(Mn+l) = \sum_{k=0}^{L-1} x(n-k) * h_{Mk+l}, \forall l = 0, 1, \ldots, M-1$$

The coefficients for each of the M polyphase stages of the interpolation filter can be represented as:

$$h^l = [h_l, h_{M+l}, h_{2M+l}, \ldots, h_{(L-1)M+l}] \forall l=0,1,\ldots,M-1$$

For every new input sample x(n), M different output samples $\{u(Mn), u(Mn+1), \ldots, u(Mn+M-1)\}$ are computed by the interpolation filter. The M different output samples, corresponding to each new input sample x(n), are also referred to a $y^l(n)$, where $$y^l(n) = u(Mn+l), \forall l = 0, 1, \ldots, M-1$$

$$y^l(n) = \sum_{k=0}^{L-1} h^l(k) x(n-k)$$

Note that to compute one output sample $y^l(n)$, L multiplication and (L−1) addition operations are required.

Figure 8:
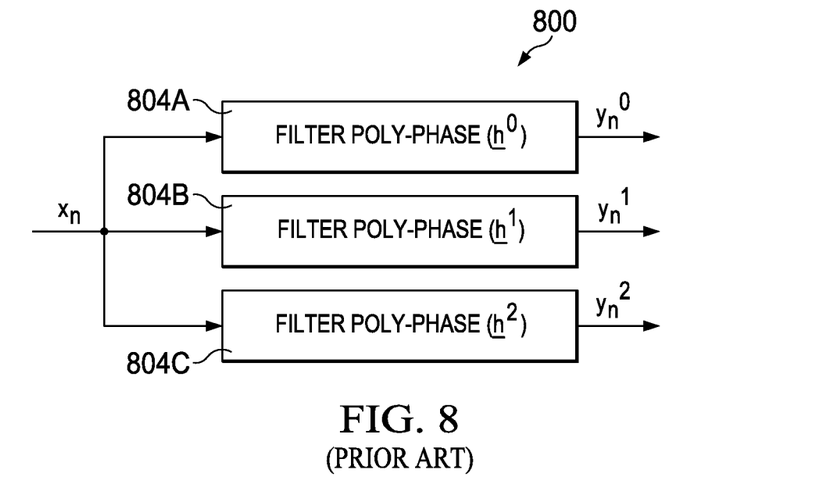
FIG. 8 depicts an interpolation filter architecture according to the prior art.

FIG. 8 depicts a high level block diagram of an interpolation-by-M filter 800 according to the prior-art, where M is 3. An input value $x_n$ is provided to each of three polyphase sub-filters 804A, 804B, 804C, which apply respective filter impulse responses $h^0$, $h^1$, $h^2$ and provide resulting output values $y_n^0$, $y_n^1$, $y_n^2$. As noted previously, the process of interpolation is achieved by inserting M−1 (i.e., two in this example embodiment) zeroes between each existing sample. However, up-sampling adds undesired spectral images to the original signal, with these spectral images centered on multiples of the original sampling rate. Low-pass filtering is then performed to remove the undesired spectral images. Interpolation can be performed using a polyphase structure. Each polyphase filter stage is generated by equivalently down-sampling the filter impulse response ($\underline{\mathbf{h}}$). For the purposes of this application, the terminology $\underline{\mathbf{h}}$, with bold and underlining is used to refer the vector of filter coefficients or the vector of sub-filter coefficient sets. The $l^{th}$ polyphaser filter used to generate the $l^{th}$ interpolated output sample $y^l(n)$, corresponding to every new input x(n), is represented as $\underline{h}^I$ and has coefficients $\{h_I, h_{M+I}, \ldots, h_{(L-1)M+I}\}$. For a finite impulse response (FIR) implementation of an interpolation filter, the calculations for each output element requires the dot product of two vectors, i.e., the input value and the associated coefficient. Since a zero-value vector adds nothing to the calculation, the efficiency of the filter can be improved by simply omitting calculations that multiply by the zero-valued insertions. For the same reason, the zero-valued insertions can also be omitted from the data stream.

Although the overall filter impulse response ($\underline{h}$) would usually be designed to be symmetric, when interpolation factor M is odd, only one among the polyphase filters ($\underline{h}^0$, $\underline{h}^1$, ..., $\underline{h}^{M-1}$) retains the property of symmetry. The remaining M−1 polyphase filters are not symmetric. This means that implementing the prior art architecture would require approximately (2*M−1)*P/(2*M) coefficient multiplication operations, where filter $\underline{h}$ has P taps. Additionally, P−M adders would be required to sum the coefficient-weighted input samples to generate the M filter outputs. When interpolation factor M is even and greater than or equal to four, none of the sub-filters may retain symmetry.

Figure 9:
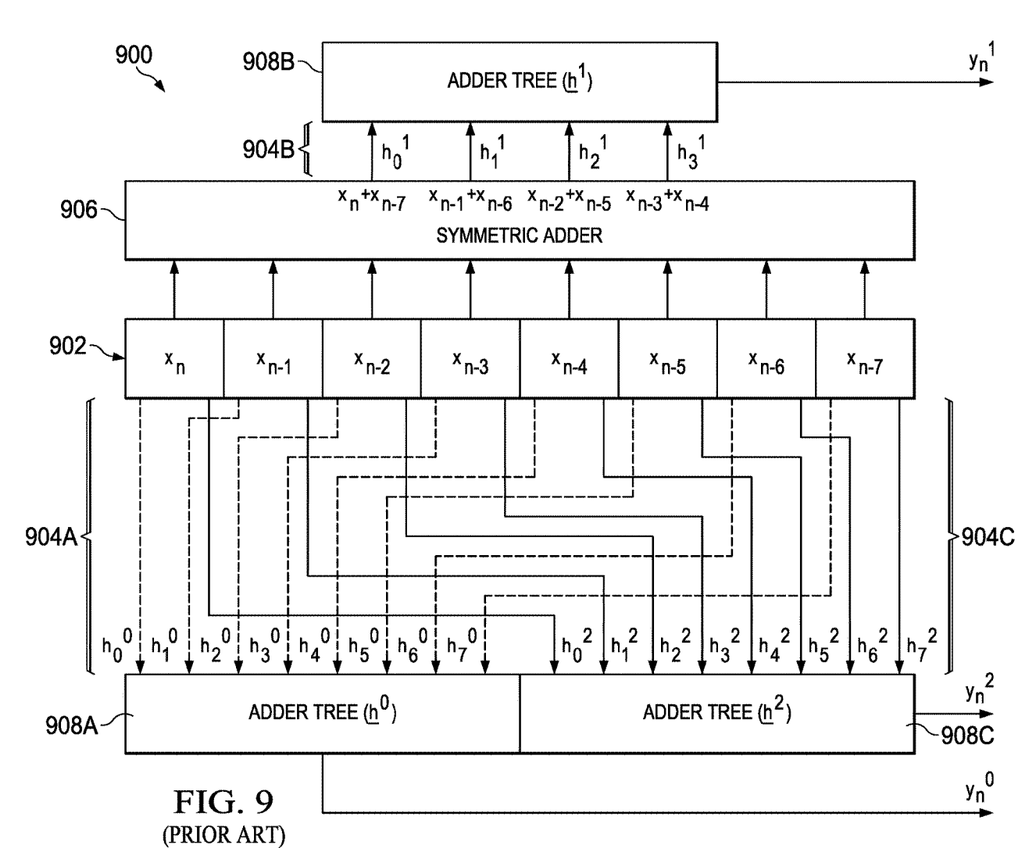
FIG. 9 depicts an implementation of the interpolation architecture according to prior art.

FIG. 9 depicts a conventional architecture of an interpolate-by-3 filter 900 for a 24 tap filter ($\underline{h}$). Filter 900 will be explained with reference to Table 1 below, which provides example coefficients for filter 900. It can be noted that filter 900 has been designed so that P=8*M, i.e., L=8. Input values, which include $x_n$ through $x_{n-7}$, are stored in a tapped-delay line 902 and are each multiplied by a respective coefficient for the sub-filter in operations 904A, 904B, 904C and provided to a respective adder tree 908A, 908B, 908C for the respective sub-filter. The coefficients for the entire filter are designed symmetrically, which can be seen from the fact that reading down each column of Table 1 and moving from left to right gives the same coefficients as reading up each column of the table from right to left. Once the coefficients are provided to the respective filters, Table 1 demonstrates that only sub-filter $\underline{h}^1$ retains the symmetry of the overall coefficients, while sub-filters $\underline{h}^0$, $\underline{h}^2$ are not symmetric. For the symmetric polyphase filter $\underline{h}^1$, the input samples 902 in the tapped delay line that correspond to this symmetry, i.e., the samples that are to be multiplied by filter coefficients having the same values, can be pre-added prior to coefficient multiplication. This is demonstrated by symmetric adder 906, which pre-adds the input values $x_n+x_{n-7}$, which share the example coefficient 85, and also pre-adds $x_{n-1}+x_{n-6}$, which share the example coefficient 0, $x_{n-2}+x_{n-5}$, which share the example coefficient −1474, and $x_{n-3}+x_{n-4}$, which share the example coefficient 9536. This means that approximately L/2 (in this example, 4) coefficient multiplications 904B, shown as $h_0^1, h_1^1, h_2^1, h_3^1$ are required for the symmetric polyphase filter, while L−1 (which in this example is 7) addition operations in adder tree 908B are still required. Polyphase filters $\underline{h}^0$, $\underline{h}^2$ each requires L multiplication operations 904A and 904B, shown as $h_0^0$–$h_7^0$, $h_0^2$–$h_7^2$, and L−1 additions in adder trees 908A and 908C, resulting in a total of approximately 5L/2 multiplication and 3L−3 addition operations for the entire filter.

TABLE 1

| | Index | | | | | | | |
|---|---|---|---|---|---|---|---|---|
| | 0 | 1 | 2 | 3 | 4 | 5 | 6 | 7 |
| $h^0$ | 18 | 258 | −1525 | 4630 | 12902 | 517 | −712 | 206 |
| $h^1$ | 85 | 0 | −1474 | 9536 | 9536 | −1474 | 0 | 85 |

TABLE 1-continued

| | Index | | | | | | | |
|---|---|---|---|---|---|---|---|---|
| | 0 | 1 | 2 | 3 | 4 | 5 | 6 | 7 |
| $h^2$ | 206 | −712 | 517 | 12902 | 4630 | −1525 | 258 | 18 |

Figure 1:
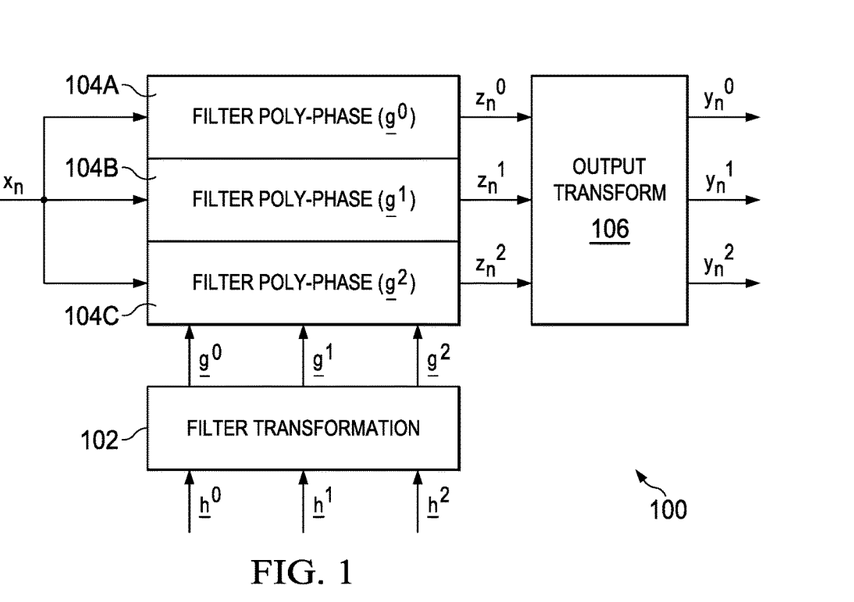
FIG. 1 depicts a transformation based interpolation filter architecture according to an embodiment of the disclosure.

Turning now to FIG. 1, novel transformation based interpolation filter architecture 100 is disclosed. In architecture 100, a filter transformation 102 is applied to the original filter ($\underline{h}$) to provide a new filter ($\underline{g}$) 104 with coefficients $\{g_0, g_1, \ldots, g_{ML-1}\}$. Input value $x_n$ is applied to each of sub-filters 104A, 104B, 104C, which are used to generate intermediate interpolated outputs $z^I(n)$, for I=0, 1, ..., M−1 (i.e., each of the sub-filters). A second transformation 106 is applied to the intermediate interpolated outputs of the filter ($\underline{g}$), i.e., $\{z_n^0, z_n^1, \ldots, z_n^{M-1}\}$, to generate the final interpolated outputs $y_n^I$, for I=0, 1, ..., M−1. The filter transformation 102 and output transformation 106 are designed to reduce the complexity and power consumption of the overall interpolation filter. Typically, the filter coefficients $\underline{h}$ would be pre-computed and hence, the transformed filter coefficients $\underline{g}$ can generally also be pre-computed. In applications that require the interpolation filter coefficients $\underline{h}$ to be programmable, the transformed filter coefficients $\underline{g}$ can be computed once coefficients $\underline{h}$ are programmed. The filter transformation $T_{FILT}$, that computes $\underline{g}$ from $\underline{h}$, is mathematically represented as:

$$\underline{g}^I = T_{filt}^{-1}(\underline{h}^0, \underline{h}^1, \ldots, \underline{h}^{M-1}), \forall I=0,1,\ldots,M-1$$

The output transformation $T_{OUT}$ is mathematically represented as:

$$y_n^I = T_{out}^{-1}(z_n^0, z_n^1, \ldots, z_n^{M-1}) \forall I=0,1,\ldots,M-1$$

In at least one embodiment, the filter transformation $T_{FILT}$ is designed to reduce the implementation complexity and power consumption of the transformed filter $\underline{g}$. This is illustrated in detail below for an example scenario of an interpolate-by-3 filter (i.e., M=3). As noted previously, the filter impulse response ($\underline{h}$) used to suppress the up-sampling images would typically be designed to be symmetric. Here, $\underline{h} = \{h_0, h_1, \ldots, h_{P-1}\}$ are the symmetric P tap filter coefficients, with P=3L, namely:

$$h_k = h_{P-1-k} = h_{3L-1-k}$$

The filter transformation $T_{FILT}$ is defined to create either symmetry or anti-symmetry in each of the polyphase sub-filters of the transformed filter ($\underline{g}^0$, $\underline{g}^1$, $\underline{g}^2$). The defined filter transformation exploits the property that the overall filter impulse response ($\underline{h}$) is initially symmetric. Consider the following filter transformation $T_{FILT}$ described mathematically as:

$$g^0 = \frac{(\underline{h}^0 + \underline{h}^2)}{2}; g^1 = \underline{h}^1; g^2 = \frac{(\underline{h}^0 - \underline{h}^2)}{2}$$

Since polyphase filter $\underline{h}^1$ was symmetric, the transformed filter $\underline{g}^1$ is also symmetric. Additionally, the transformed filter response $\underline{g}^0$ will be symmetric and the transformed filter response $\underline{g}^2$ will be anti-symmetric, as shown below:

$$g_{L-1-m}^0 =$$

$$\frac{\{h_{L-1-m}^0 + h_{L-1-m}^2\}}{2} = \frac{\{h_{(3L-3-3m)} + h_{(3L-3-3m)+2}\}}{2} = \frac{\{h_{3m+2} + h_{3m}\}}{2} = g_m^0$$

$$g_{L-1-m}^2 = \frac{\{h_{L-1-m}^0 - h_{L-1-m}^2\}}{2} =$$

$$\frac{\{h_{(3L-3-3m)} - h_{(3L-3-3m)+2}\}}{2} = \frac{\{h_{3m+2} - h_{3m}\}}{2} = -g_m^2$$

This is further illustrated in Table 2 below, which illustrates the transformed filter coefficients from the example filter in Table 1.

TABLE 2

| | Index | | | | | | | |
|---|---|---|---|---|---|---|---|---|
| | 0 | 1 | 2 | 3 | 4 | 5 | 6 | 7 |
| $g^0$ | 112 | −227 | −504 | 8766 | 8766 | −504 | −227 | 112 |
| $g^1$ | 85 | 0 | −1474 | 9536 | 9536 | −1474 | 0 | 85 |
| $g^2$ | −94 | 485 | −1021 | −4136 | 4136 | 1021 | −485 | 94 |

Because filter response $g^0$ is symmetric, calculating an intermediate output value requires only about L/2 multiplication operations. For the anti-symmetric filter response $g^2$, the input samples that correspond to the anti-symmetric coefficients can be pre-subtracted resulting in approximately L/2 multiplication operations. Accordingly, the transformed filter g requires approximately 3L/2 (e.g., 12) multiplication operations, as opposed to approximately 5L/2 (e.g., 20) multiplication operations that are required for $\underline{h}$, a nearly 40% reduction in multiplication operations.

The output transform $T_{OUT}$ is mathematically defined to reconstruct the final interpolated outputs $\{y^0(n), y^1(n), y^2(n)\}$, from the intermediate interpolated outputs $\{z^0(n), z^1(n), z^2(n)\}$, as shown below:

$$y^0(n) = \{z^0(n) + z^2(n)\}; y^1(n) = z^1(n); y^2(n) = \{z^0(n) - z^2(n)\}$$

Note that the output transformation $T_{OUT}$, when applied to the coefficients of the transformed filter ($\underline{g}$) would also reconstruct the coefficients of the original filter ($\underline{h}$). Although the example filter transformation $T_{FILT}$ and output transformation $T_{OUT}$ has been described for M=3, they can be easily extended for any M, as given below:

$$g^k = \frac{(h^k + h^{M-1-k})}{2}; g^{M-1-k} = \frac{(h^k - h^{M-1-k})}{2};$$

$$\forall\, k = 0, 1, \ldots, \lfloor M/2 \rfloor - 1 \text{ and}$$

$$y^k(n) = z^k(n) + z^{M-1-k}(n); y^{M-1-k}(n) = z^k(n) - z^{M-1-k}(n);$$

$$\forall\, k = 0, 1, \ldots, \lfloor M/2 \rfloor - 1$$

Additionally, $g^{\lfloor M/2 \rfloor} = \underline{h}^{\lfloor M/2 \rfloor}$ and $y^{\lfloor M/2 \rfloor}(n) = z^{\lfloor M/2 \rfloor}(n)$ if M is an odd integer.

The above equations hold good, when the number of taps in $\underline{h}$, namely P, is of the form P=M*L, where L is an integer. If the number of taps in $\underline{h}$ is not an integer multiple of M, the proposed solution still holds; however, the pairs of sub-filters in $\underline{h}$ to be used to create the symmetric and anti-symmetric pairs are the sub-filters that share the same coefficient values, but in a flipped order with respect to the other sub-filter in the pair.

Figure 2:
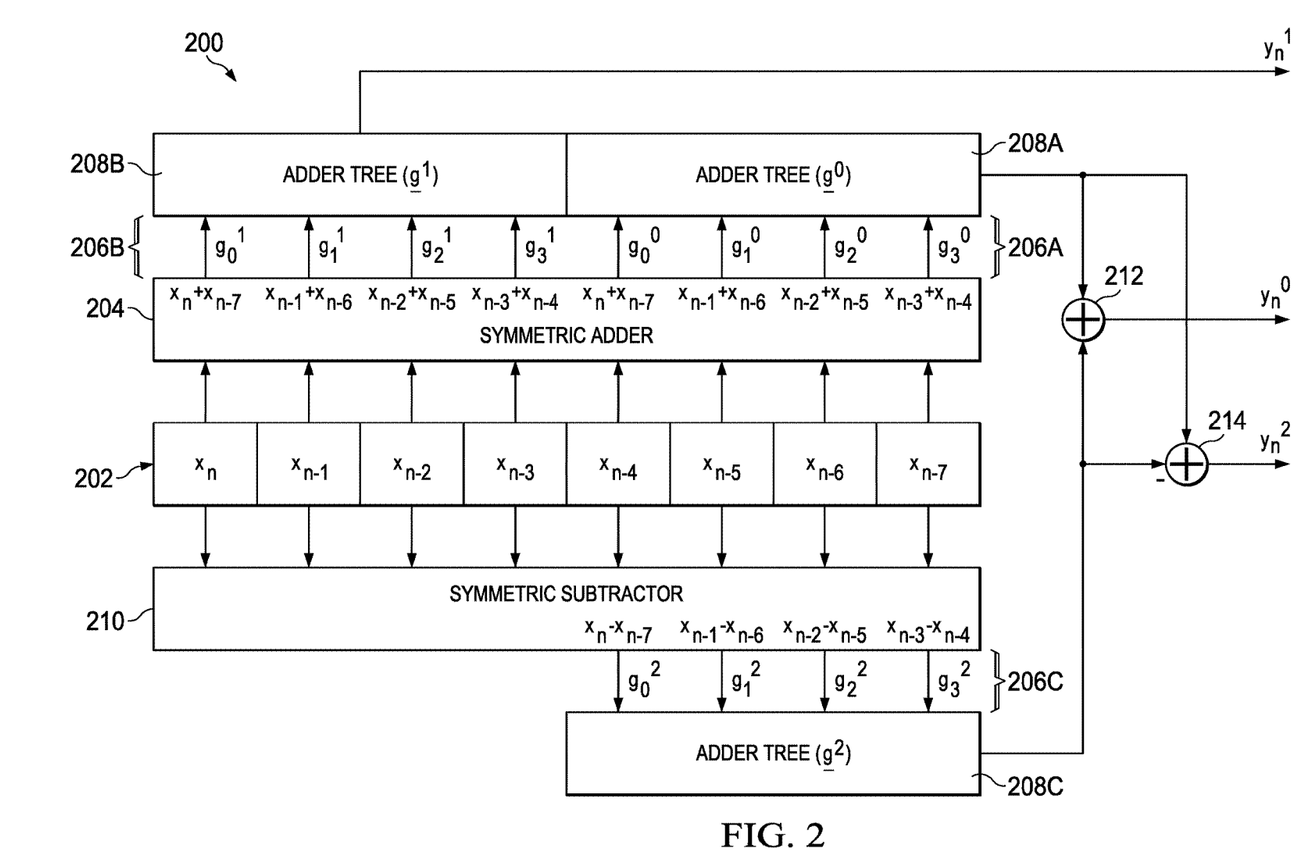
FIG. 2 depicts an implementation of the transformation based interpolation filter architecture according to an embodiment of the disclosure.

An illustrative implementation of a transformation based interpolation filter 200 is shown in FIG. 2 for the case of M=3 and P=24 (L=8). In interpolation filter 200, the input samples $\{x_n, x_{n-1}, \ldots, x_{n-7}\}$ are stored in a tapped delay line 202 containing a number of delay elements. A symmetric subtractor 210 is used to compute $\{(x_n - x_{n-7}), (x_{n-1} - x_{n-6}), \ldots, (x_{n-3} - x_{n-4})\}$. The outputs of the symmetric subtractor 210 are multiplied 206C by the coefficients of the anti-symmetric polyphase transformed interpolation filter $\mathbf{g}^2$, namely $\{g_0^2, g_1^2, \ldots, g_3^2\}$ and provided to adder tree 208C. A symmetric adder 204 is used to compute $\{(x_n + X_{n-7}), (x_{n-1} + x_{n-6}), \ldots, (x_{n-3} + x_{n-4})\}$. The outputs of the symmetric adder 204 are multiplied 206A by the coefficients of the symmetric polyphase transformed interpolation filter $\mathbf{g}^0$, namely $\{g_0^0, g_1^0, \ldots, g_3^0\}$ and provided to adder tree 208C. Since the number of filter coefficient taps P is a multiple of the interpolation factor M, the output of the symmetric adder 204 can also be reused for multiplication 206B with the coefficients of the other symmetric polyphase transformed interpolation filter $\mathbf{g}^1$, namely $\{g_0^1, g_1^1, \ldots, g_3^1\}$ and provided to adder tree 208B. This sharing of symmetric adder outputs between the two symmetric polyphase filters results in a savings of L/2 addition operations for an interpolation factor of M=3. The outputs of adder tree 208A and adder tree 208C are provided to transformation element 212, which adds the provided outputs to provide a final value $Y_n^0$; the outputs of adder tree 208A and adder tree 208C are also provided to transformation element 214, which subtracts the provided outputs to provide a final value $Y_n^2$.

For interpolation factors greater than three, the outputs of both the symmetric adders and the symmetric subtractors can be shared by the symmetric and anti-symmetric filters of the transformed interpolation filters, respectively. This would result in a savings of (M−2)*L/2 adder operations, when P=M*L. For the case when the number of filter taps P is not a multiple of M, some of the polyphase transformed filters would have P/M (rounded up) taps and the rest would have P/M (rounded down) taps. Sharing of symmetric adders and symmetric subtractors is still possible among the sets of symmetric and anti-symmetric transformed polyphase filters that have the same number of taps. However, by imposing the constraint that P is an integer multiple of the interpolation factor M, we maximize the savings in addition/subtraction operations.

Figure 3:
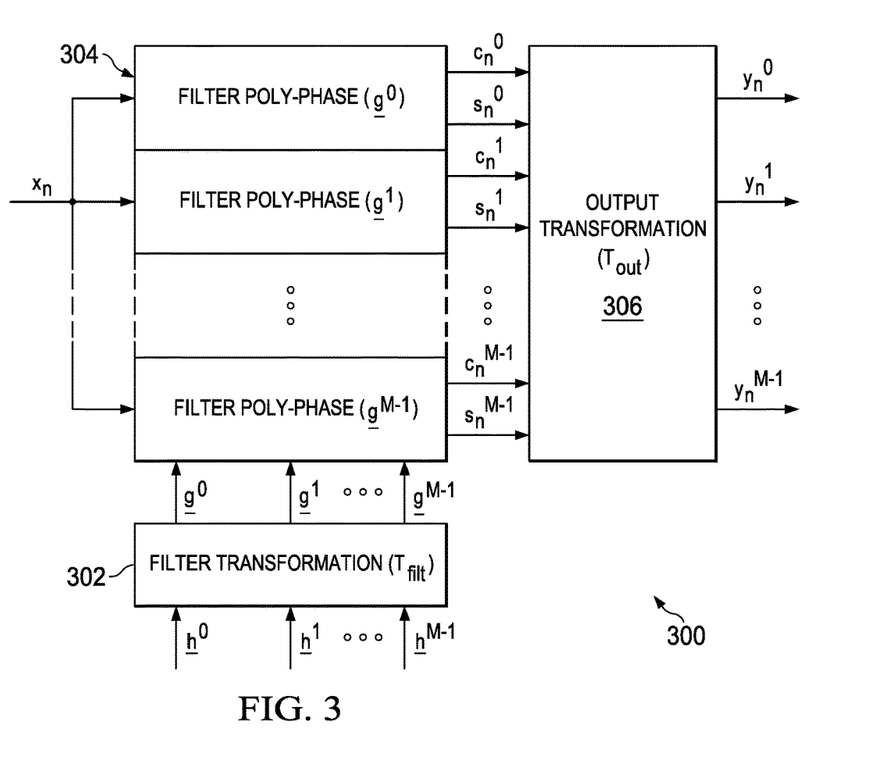
FIG. 3 depicts a transformation based interpolation filter architecture according to an embodiment of the disclosure.

FIG. 3 presents another embodiment of a transformation based interpolation filter architecture, in which filter transformation 302 again transforms the original sub-filter coefficients $\underline{h}^0$, $\underline{h}^1$, $\underline{h}^2$ to provide transformed coefficients $\mathbf{g}^0$, $\mathbf{g}^1$, $\mathbf{g}^2$ but each of the transformed polyphase filters 304 now outputs a carry and a partial sum value $\{c^k(n), s^k(n)\}$, corresponding to each of the intermediate interpolated outputs $z^k(n)$. The use of carry-save logic avoids the need for a ripple adder in the computation of the intermediate interpolated outputs and eases timing closure of the digital logic. Mathematically, $z^k(n) = 2*c^k(n) + s^k(n)$. The carry/sum values corresponding to each of the intermediate interpolated outputs are then appropriately combined in the output transformation module 306 to generate the final interpolated outputs $y^k(n)$.

Figure 4:
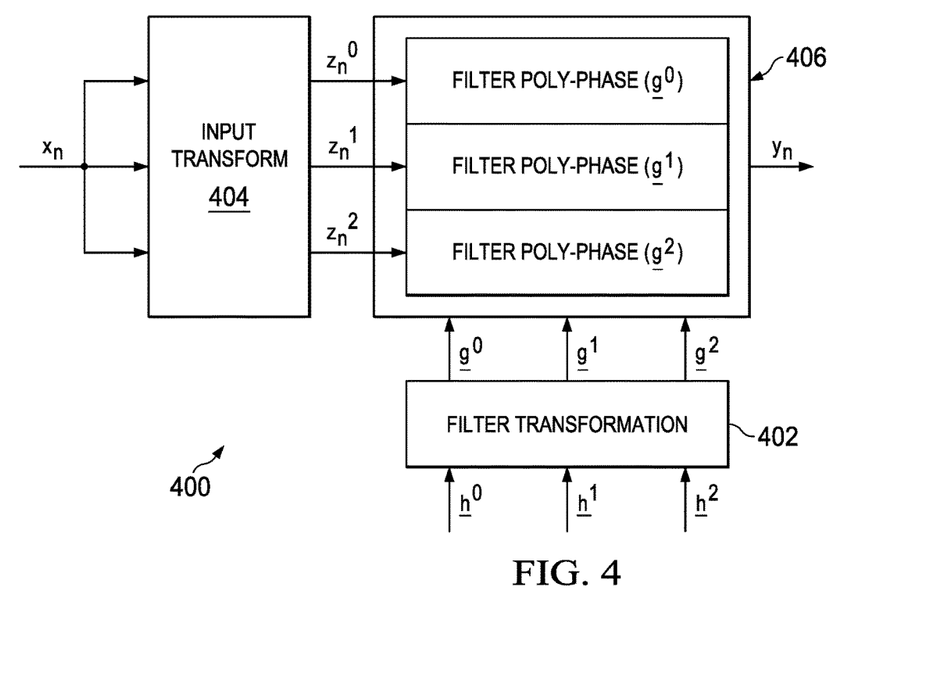
FIG. 4 depicts a transformation based decimation filter architecture according to an embodiment of the disclosure.

Although the concept of transformed coefficients has been largely presented for interpolate-by-M filters, this concept can also be applied to decimate-by-M filters. FIG. 4 depicts example architecture 400 for a decimate-by-M filter, with M equal to 3. In decimation architecture 400, the filter transformation 402 is applied analogously to the original coefficients of the sub-filters. However, in the decimation filter architecture, the output transformation is replaced by an input transformation 404. The input sample $x_n$ is transformed by an input transformation to generate transformed intermediate samples $z_n^0$, $z_n^1$, $z_n^2$. The transformed intermediate samples are filtered using transformed polyphase filters 406. The M polyphase filter output samples are then added to obtain the intended decimated output sample.

Figure 5:
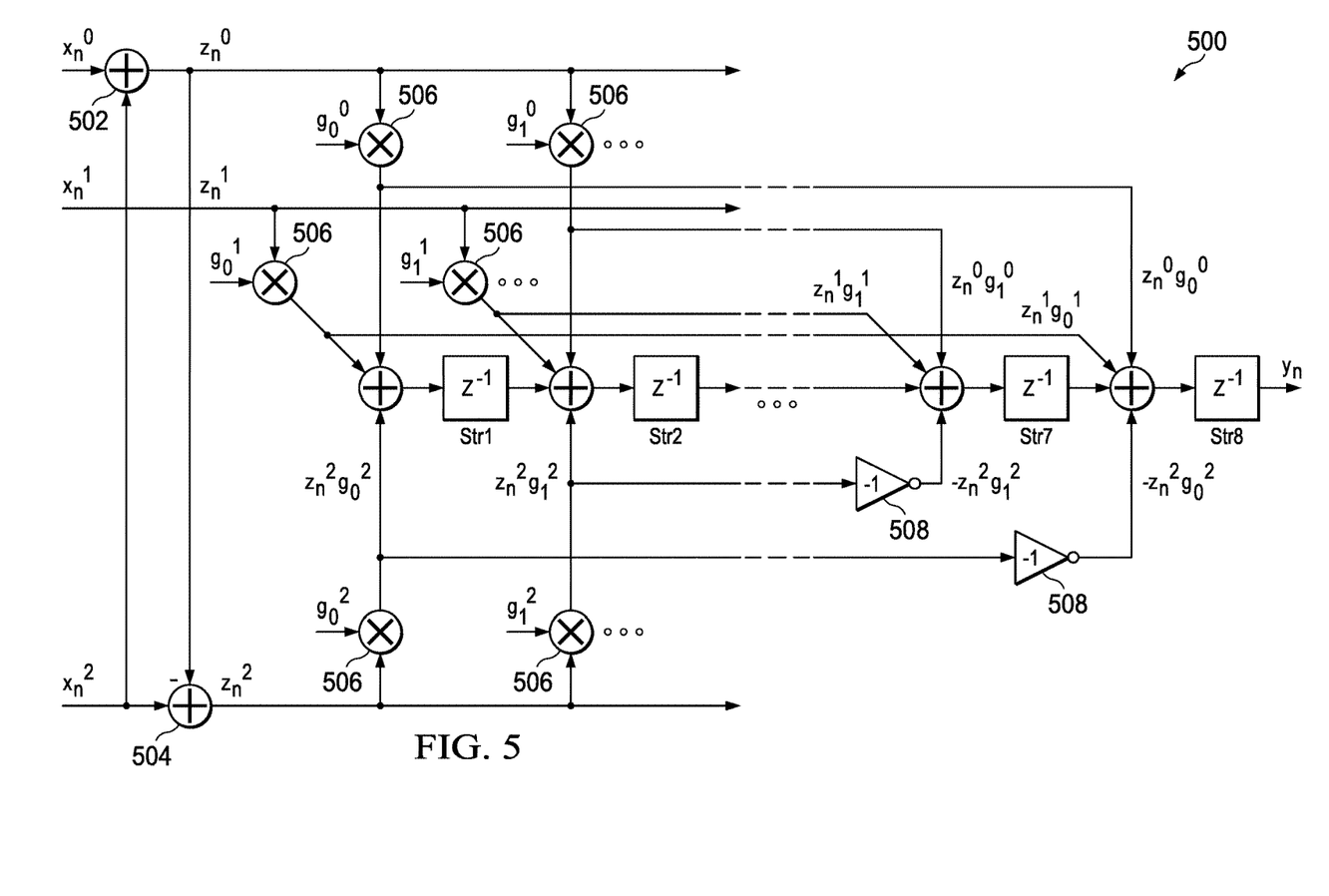
FIG. 5 depicts an implementation of the transformation based decimation filter architecture according to an embodiment of the disclosure.

FIG. 5 depicts an example implementation of the transformation based decimation architecture for the case of M=3 and P=24 (L=8). In the decimation filter 500, for every 3 input samples $\{x_n^0, x_n^1, x_n^2\}$ a decimated output sample $y_n$ is generated. First, the input samples go through an input transformation that generates the intermediate outputs $\{z_n^0, z_n^1, z_n^2\}$. In the example shown, input samples $x_n^0$ and $x_n^2$ are added at element 502 and input sample $x_n^2$ is subtracted from $x_n^0$ at element 504. Intermediate sample $z_n^1$ is equal to $x_n^1$, so no transformation is necessary for this sample. The intermediate outputs are provided as the input to the three transformed poly-phase filters $\{g^0, g^1, g^2\}$, respectively, for filtering and the poly-phase filter outputs are decimated by adding them together. A transpose form implementation of the decimation filter has been considered, in which the input to each of the poly-phase filters is scaled at elements 506 by all of the coefficients, for example $z_n^0$ by $\{g_0^0, g_1^0, \ldots, g_3^0\}$. In a transpose form implementation, the final output is computed by sequentially accumulating the coefficient scaled inputs of each the poly-phase filters and storing each of the partial sums using a delay element Str1-Str8. In an alternate embodiment, the stream of arriving input samples can be provided without being stored in any delay elements for a decimation filter. The decimated output $y_n$ is generated at the output of the final delay element Str8. As the transformed filter has either symmetric or anti-symmetric property, it is exploited to reduce the number of coefficient multiplication operations by performing only 4 multiplications for each of the transformed poly-phase filters. The coefficient scaled outputs corresponding to the other 4 coefficients of the poly-phase filters are obtained from these by reusing them as is for the symmetric poly-phase filters $g^0$ and $g^1$ and negating them using inverters 508 for the anti-symmetric poly-phase filter $g^2$. This enables a similar reduction in multiplication operations from 20 to 12. The input transformation used in this transformed decimation filter implementation is given as $$z^0(n) = \{x^0(n) + x^2(n)\}; z^1(n) = x^1(n); z^2(n) = \{x^2(n) - x^0(n)\}$$

and the filter transformation is given as $$g^0 = \frac{(h^0 + h^2)}{2}; g^1 = h^1; g^2 = \frac{(h^0 - h^2)}{2}$$

One interesting property of the transformed filters, whether for interpolation or decimation, is that while a polyphase filter is generally designed to suppress the undesired spectral images created by the interpolation/decimation, the transformed filters, e.g., polyphase filters 104, 406, by themselves, do not suppress these undesired spectral images. It is only when combined with the additional transformation, e.g., output transform 106 or input transform 404, that undesired spectral images are suppressed.

Table 3 compares the implementation complexity (i.e., the number of multiplication/addition operations) for the proposed solution over prior art, for different interpolation factors M and number of filter taps P. The disclosed embodiments result in a savings of over forty percent in the number of multiplication operations and reduce the number of addition operations by ten to thirty percent. This reduction in operations also results in a direct savings in digital area and power consumption of the interpolation filters.

TABLE 3

| Parameters | Prior Art | | Proposed Solution | | Savings (%) | |
| --- | --- | --- | --- | --- | --- | --- |
| (M, P) | Multipliers | Adders | Multipliers | Adders | Multipliers | Adders |
| M = 3; P = 24 | 20 | 21 | 12 | 19 | 40% | ~10% |
| M = 3; P = 60 | 50 | 57 | 30 | 49 | 40% | ~14% |
| M = 5; P = 40 | 36 | 35 | 20 | 27 | ~44% | ~23% |
| M = 5; P = 100 | 90 | 95 | 50 | 69 | ~44% | ~27% |
| M = 7; P = 56 | 52 | 49 | 28 | 35 | ~46% | ~28% |
| M = 7; P = 140 | 130 | 133 | 70 | 89 | ~46% | ~33% |

Unlike the prior art solution, the disclosed embodiments employ a transformed polyphase filter to obtain intermediate interpolated outputs and uses an output transformation on the intermediate outputs to obtain the intended interpolated outputs. With appropriate design of filter transformation and output transformation, this technique enables all transformed polyphase filter to be either symmetric or anti-symmetric, thereby reducing the filter implementation complexity. It will be recognized that although an example transformation for the coefficients and intermediate results has been shown, any number of other transformations can be utilized to provide the desired symmetric/anti-symmetric sub-filters. If implemented using digital logic, the disclosed technique would reduce the area and power consumption of an implementation. If implemented using a digital signal processor (DSP) or a micro-controller, the disclosed technique would reduce the million instructions per second (MIPS) requirement for the filter computations. The disclosed transformation filter results in savings of area and power consumption of interpolate-by-M filter implementation, where M is an odd integer. In one example for an interpolate-by-3 filter, the digital area reduces by approximately thirty-five percent with the proposed technique. The disclosed transformation filter also results in savings of area and power consumption of a decimate-by-M filter implementation, where M is an odd integer.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An electronic device comprising:
an analog-to-digital converter coupled to receive an analog input signal and to provide a digital signal;
a digital down-converter, the digital down-converter comprising:
a digital decimation filter for decimating by M, the digital decimation filter comprising:
a first transformation circuit coupled to perform a first transformation on input values of the digital signal and to provide transformed input values, and
a filter block comprising a pair of sub-filters having respective transformed coefficients, the respective transformed coefficients of a first sub-filter of the pair of sub-filters being symmetric and the respective transformed coefficients of a second sub-filter of the pair of sub-filters being anti-symmetric, the filter block being coupled to receive the transformed input values and to provide final outputs of the digital decimation filter.

2. The electronic device as recited in claim 1 further comprising a second transformation circuit coupled to receive respective programmed coefficients for the pair of sub-filters and to provide the respective transformed coefficients for the pair of sub-filters.

3. The electronic device as recited in claim 2 wherein the first transformation circuit sums a first input value and a second input value of the digital signal to form a first transformed intermediate value and subtracts the second input value from the first input value to form a second transformed intermediate value of the transformed intermediate values.

4. The electronic device as recited in claim 2 wherein the first transformation circuit further performs scaling.

5. The electronic device as recited in claim 1 wherein M is an odd integer.

6. The electronic device as recited in claim 1 wherein the electronic device is a receiver.

7. An electronic device comprising:
a digital up-converter, the up-converter comprising:
a digital interpolation filter for interpolating by M, where M is an integer, the digital interpolation filter comprising:
a filter block comprising a pair of sub-filters having respective transformed coefficients, the respective transformed coefficients of a first sub-filter of the pair of sub-filters being symmetric and the respective transformed coefficients of a second sub-filter of the pair of sub-filters being anti-symmetric,
delay elements coupled to provide input values to the filter block, and
a first transformation circuit coupled to receive intermediate outputs from the filter block and to perform a first transformation on the intermediate outputs to form final outputs of the pair of sub-filters, the filter block and the first transformation circuit together providing suppression of undesired spectral images in final outputs of the digital interpolation filter; and
a digital-to-analog converter coupled to receive the final outputs of the digital interpolation filter and to provide an analog output signal.

8. The electronic device as recited in claim 7 wherein the first transformation circuit sums a respective intermediate value provided by the first sub-filter and a respective intermediate value provided by the second sub-filter to form a respective final output of the first filter and subtracts a respective intermediate value provided by the second sub-filter from a respective intermediate value provided by the first sub-filter to form a respective final output of the second filter.

9. The electronic device as recited in claim 8 wherein the first transformation circuit further performs scaling.

10. The electronic device as recited in claim 8 wherein M is an odd integer.

11. The electronic device as recited in claim 8 wherein the respective intermediate values each comprise a carry and a partial sum.

12. The electronic device as recited in claim 7 wherein the electronic device is a transmitter.

* * * * *